(12) United States Patent
Sun

(10) Patent No.: US 9,482,770 B2
(45) Date of Patent: Nov. 1, 2016

(54) RESIDUAL MOVEOUT ESTIMATION THROUGH LEAST SQUARES INVERSION

(75) Inventor: Hongchuan Sun, Katy, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 1089 days.

(21) Appl. No.: 13/403,707

(22) Filed: Feb. 23, 2012

(65) Prior Publication Data

US 2012/0241166 A1 Sep. 27, 2012

Related U.S. Application Data

(60) Provisional application No. 61/466,345, filed on Mar. 22, 2011.

(51) Int. Cl.
G06G 7/48 (2006.01)
G01V 1/30 (2006.01)
G01V 1/34 (2006.01)
G06F 17/50 (2006.01)

(52) U.S. Cl.
CPC . *G01V 1/30* (2013.01); *G01V 1/34* (2013.01); *G06F 17/50* (2013.01)

(58) Field of Classification Search
CPC ...... G06F 17/50; G01V 1/306; G01V 1/362; G01V 1/364; G01V 1/3808; G01V 1/34
USPC ........................... 703/10, 6; 367/52; 166/369
See application file for complete search history.

(56) References Cited

U.S. PATENT DOCUMENTS

| | | | |
|---|---|---|---|
| 5,570,321 A * | 10/1996 | Bernitsas | ........................ 367/38 |
| 5,895,437 A | 4/1999 | Cesare et al. | |
| 6,049,759 A | 4/2000 | Etgen | |
| 6,864,890 B2 | 3/2005 | Meek et al. | |
| 7,328,107 B2 | 2/2008 | Strack et al. | |
| 7,493,241 B2 | 2/2009 | Lee | |
| 2002/0049540 A1* | 4/2002 | Bevc et al. | ........................ 702/2 |
| 2004/0199330 A1* | 10/2004 | Routh et al. | .................... 702/14 |
| 2007/0203673 A1* | 8/2007 | Sherrill et al. | ................ 702/189 |
| 2009/0303834 A1 | 12/2009 | Sengupta et al. | |
| 2010/0074053 A1 | 3/2010 | Jaiswal et al. | |
| 2011/0147004 A1* | 6/2011 | Neelamani | ............... G01V 1/36 166/369 |
| 2012/0218861 A1* | 8/2012 | Xia et al. | ........................ 367/73 |

OTHER PUBLICATIONS

Duquet, Bertrand et al., "Filtering Coherent Noise During Prestack Depth Migration", Nov. 2-7, 1997, SEG Annual Meeting, Society of Exploration Geophysicists.*

Lee, Stan et al., "Illuminating the Shadows: Tomography, Attenuation and Pore Pressure Processing in the South Caspian Sea", 1999, Journal of Petroleum Science and Engineering, 24, Elsevier B.V.*

(Continued)

*Primary Examiner* — Cedric D Johnson
(74) *Attorney, Agent, or Firm* — ExxonMobil Upstream Research—Law Department

(57) ABSTRACT

Method for estimating residual moveout in common image gathers (51) of seismic data for use in velocity tomography (57). The method iteratively (56) flattens (55) the common image gathers against a specified reference trace through the application of conjugate-gradient least-squares inversion (53). Different from other picking methods which need to identify and track strong amplitudes, the inventive method automatically inverts for the depth residual for every grid point in the image gather. There is no need to identify and track events.

12 Claims, 6 Drawing Sheets

(56) References Cited

OTHER PUBLICATIONS

Shen, Peng et al., "Automatic Velocity Analysis via Shot Profile", Feb. 10, 2008, Department of Computational and Applied Mathematics, Rice University.*
Nakashima, Yuichi et al., "Estimation of Groundwater Level by GPR in an Area with Multiple Ambiguous Reflections", 2001, Journal of Applied Geophysics, 47, Elsevier Science B.V.*
Maas, Steve et al., "Reservoir Monitoring, 4D Signal, and Fiber-Optic Technology", Mar. 2-3, 2009, Petroleum Geology Conference and Exhibition, Geological Society of Malaysia.*
Adler, Frank et al., "Nonlinear 3D Tomographic Least-Squares Inversion of Residual Moveout in Kirchhoff Prestack-Depth-Migration Common-Image Gathers", Sep.-Oct. 2008, Geophysics, vol. 73, No. 5, Society of Exploration Geophysicsts.*
Adler, Frank et al., "Nonlinear 3D Tomographic Least-Squares Inversion of Residual Moveout in Kirchhoff Prestack-Depth Migration Common-Image Gathers", Sep.-Oct. 2008, Geophysics, vol. 73, No. 5, Society of Exploration Geophysicists.*
Zhou, Chaoguang et al., "True Geometry Tomography for Velocity Model Building with Applications to WATS Seismic Data", 2008, SEG Las Vegas Annual Meeting.*
Jurado, Fabrice et al., "Full-Wave Inversion Strategy Using Traveltime Formulation and Layer-Based Parameterization", Oct. 25-29, 1992, SEG Annual Meeting, Society of Exploration Geophysicists.*
Bayasal, E. et al. (1983), "Reverse-time migration," *Geophysics* 48, pp. 1514-1524.
Bevc, D. (1997), "Imaging complex structures with semi-recursive Kirchhoff migration," *Geophysics* 62, pp. 577-588.
Gray, S. H. (1994), "Kirchhoff migration using Eikonal equation traveltimes," *Geophysics* 59, pp. 810-817.
Kurin, E., et al. (2003), "An algorithm for semi-automated traveltime picking based on the non-hyperbolic moveout," *Expanded Abstracts*, 73$^{rd}$ Annual International Meeting, SEG, pp. 2168-2171.
Lee, R. (2001), "Pitfalls in seismic data flattening," *The Leading Edge* 20, pp. 160-164.
Lomask, J., et al. (2006), "Flattening without picking," *Geophysics* 71, pp. 13-20.
McMechan, G. A. (1983), "Migration by extrapolation of time-dependent boundary values," *Geophysical Prospecting* 31, pp. 413-420.
Parks, D. et al. (2008), "Defining regions in seismic images by flattening," Center for Wave Phenomena, Colorado School of Mines, CWP-592, pp. 67-74.
Siliqi, R.P., et al. (2007), "High order RMO picking using uncorrelated parameters," *Expanded Abstracts*, 77$^{th}$ Annual International Meeting, SEG, pp. 2772-2775.
Sun, Y., et al. (2000), "3-D prestack Kirchhoff beam migration for depth imaging," *Geophysics* 65, pp. 1592-1603.
Whitmore, N.D. (1983), "Iterative depth migration by backward time propagation," *Expanded Abstracts*, 53$^{rd}$ Annual International Meeting, SEG, pp. 382-385.

\* cited by examiner

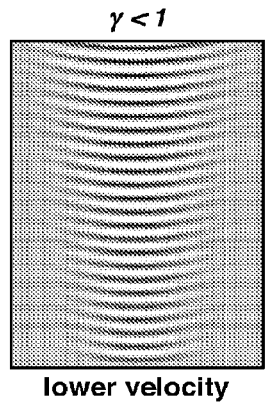
lower velocity
FIG. 1A
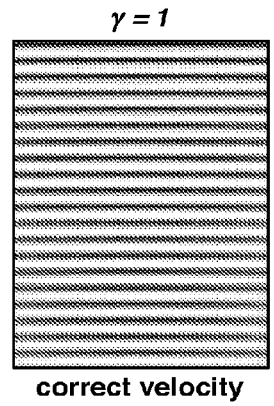
correct velocity
FIG. 1B
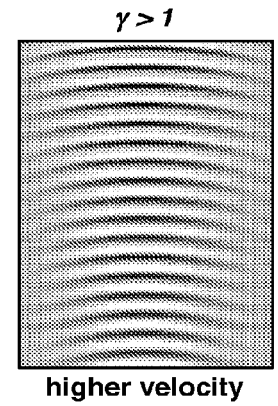
higher velocity
FIG. 1C
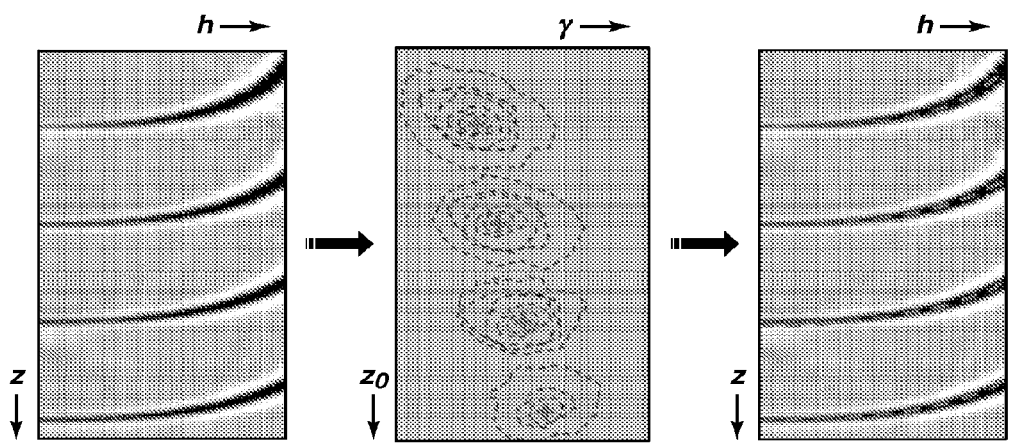
FIG. 2A    FIG. 2B    FIG. 2C

Input Gathers

Depth Residual

Picking

Flattening

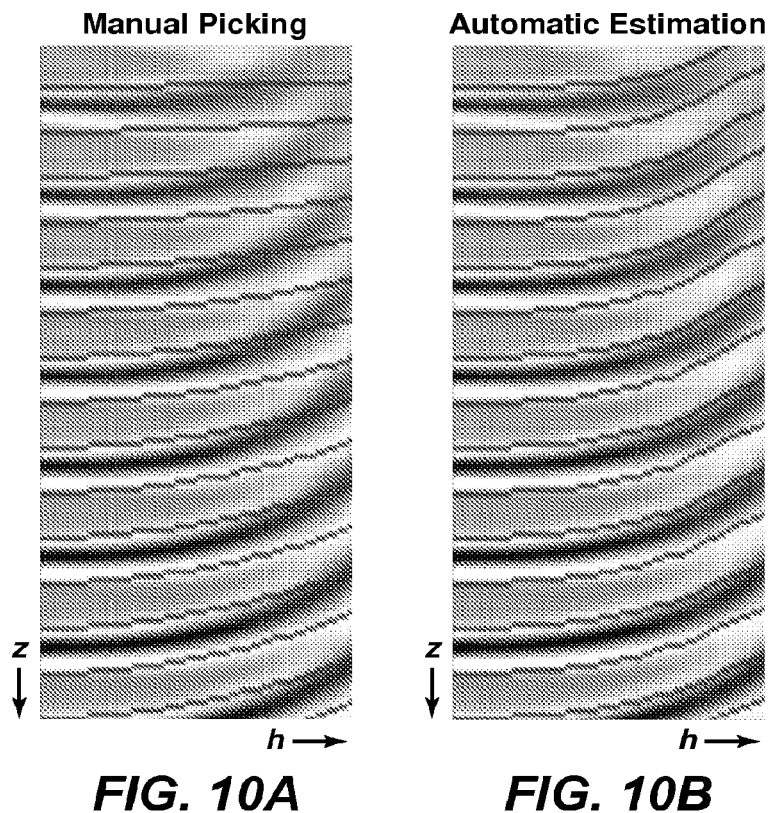
FIG. 10A    FIG. 10B
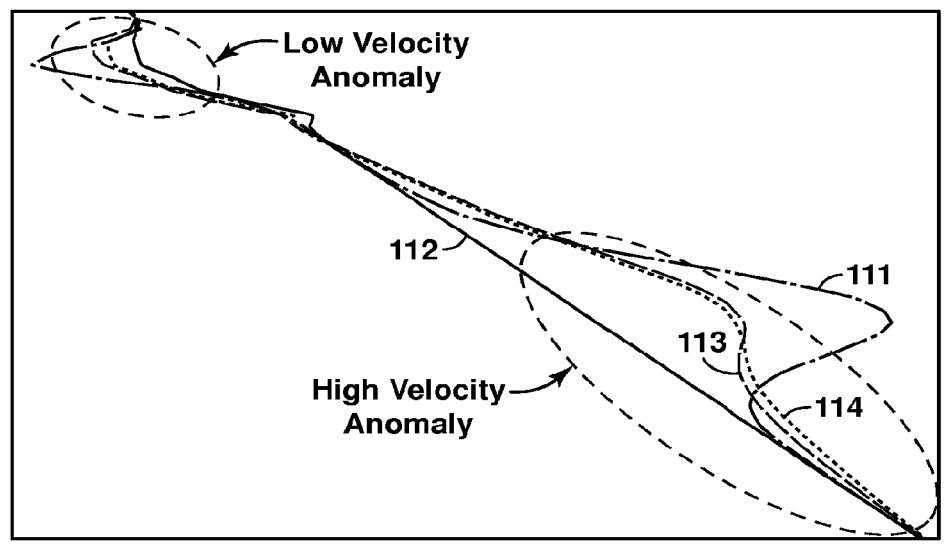
FIG. 11

RESIDUAL MOVEOUT ESTIMATION THROUGH LEAST SQUARES INVERSION

This application claims the benefit of U.S. Provisional Patent Application No. 61/466,345, filed Mar. 22, 2011, entitled RESIDUAL MOVEOUT ESTIMATION THROUGH LEAST SQUARES INVERSION, the entirety of which is incorporated by reference herein.

FIELD OF THE INVENTION

The invention relates generally to the field of geophysical prospecting and, more particularly, to seismic data processing. Specifically, the invention is a method for estimating residual moveout in common image gathers of seismic data for use in velocity tomography.

BACKGROUND OF THE INVENTION

The Technical Problem

A main purpose of imaging in seismic data processing is to place subsurface reflectors in their correct relative spatial relationships. Imaging requires an accurate subsurface acoustic velocity model. A typical velocity model building cycle consists of three steps: migration imaging of seismic data to generate subsurface common image gathers; picking of residual moveouts in the common image gathers; and tomographic inversion for velocity updates using the picking results as input data. The present invention is a method for performing the middle step of the three: how to estimate residual moveouts in the common image gathers for use in velocity tomography.

When seismic traces with different offsets (source-receiver spacing) are migrated and then gathered together at the same subsurface image point, the different traces will show the subsurface reflector at a different apparent depth because of an inaccurate migration velocity, which phenomenon is called residual moveout in the common image gather domain. It is desirable to correct the common image gather for residual moveout so that all the events in the gather are flattened, thereby improving the quality of the final stacked image. To correct for residual moveout requires adjusting the subsurface velocity throughout the regions where the waves travel from source to image point and then to receiver. By evaluating the flatness of the residual moveout, imaging geophysicists can judge whether the subsurface velocity model that they have built is accurate enough or not. Because the residual moveouts are quantified by the corresponding errors in depth, they are typically called depth residuals.

Ray-based depth imaging methods (Gray and May, 1994; Bevc, 1997; Sun et al, 2000) and wave-based depth imaging methods (Baysal et al., 1983; Whitmore, 1983; McMechan, 1983) have been widely used to generate the subsurface common image gathers. During the imaging process, if the source-receiver offset (the spacing between source and receiver at a given activation of the source) is indexed, then the obtained image gathers are called offset domain common image gathers. (This refers to the domain after migration of the data, i.e. after application of a depth migration algorithm to the pressure vs. time data, at which point the vertical axis becomes depth and the horizontal axis is offset.) On the other hand, if the angle between the incident ray and the reflected ray is indexed, then the image gathers are called angle domain common image gathers. In either case, the flatness of the image gathers is an important indication to whether the migration velocity is accurate or not. Flatness means that all offsets or angles in the gather are imaged at the same depth. If the events in the common image gathers are flat, then the velocity used for imaging is correct. More often, however, the events in common image gathers are not flat, which situation is typically called residual moveout. When the events curve upward, it means the imaging velocity is too slow, and when the events curve downward, it means the imaging velocity is too fast. Velocity model building techniques aim at constructing an accurate velocity model via flattening the residual moveouts in either offset domain or angle domain common image gathers.

To flatten the residual moveouts in common image gathers, we first need to estimate the depth shifts along each residual moveout. A widely used manual picking technology assumes that each residual moveout can be approximated by a hyperbolic or parabolic curve. As a result, a selection of the hyperbolic or parabolic curvature is equivalent to the picking of the entire residual moveout. When image gathers are contaminated with strong noise, this manual picking method is relatively reliable because users can discriminate between signal and coherent noise using their interpretation knowledge. However, this method is very time consuming which in practice often makes 3-D model building unaffordable. To estimate the residual moveouts more efficiently, some automatic picking algorithms have been developed, among which cross-correlation is widely used. These algorithms are computationally efficient, but they tend to generate local solutions to the depth shifts. Furthermore, their solutions are sensitive to the size of the cross-correlation window and are vulnerable to the signal-to-noise ratio of the input gathers.

As noted above, most existing residual moveout estimation methods are either time consuming or not reliable. Reliability is critical to the entire iterative model building process because the picking results are input data to the tomographic inversion algorithm and the model updates depend to a considerable degree on how we estimate the residual moveouts. An objective of the present invention is to efficiently and reliably estimate the residual moveouts, which ultimately will help to improve the final model building quality.

Existing Technology

Lee (2001) describes how to avoid pitfalls in seismic data flattening. This method attempts to determine the bed thickness and reconstruct the paleosurfaces, both of which are important parts of seismic interpretation. For instance, meandering channels are better focused on a horizontal slice with data flattening being taken into account. To flatten the data, however, horizons need to be picked throughout the entire data volume which turns out to be very time consuming.

Lomask et al. (2006) present an efficient dense-picking method for flattening seismic data. This method first estimates local dips of seismic events, then converts the local dips into time shifts. Their paper contains applications to pre-stack data volumes, not post-stack image gathers to which model building is closely related. The quality of their flattening results can be heavily affected by noise in the data where coherent crossing events cannot be effectively handled. In addition, when applied to residual moveout, this method may not converge to the global minima.

Siliqi et al. (2007) introduces an automatic picking technique for dense estimation of high order residual moveout curves. This method uses Taylor series expansions to approximate the real curvature of the event and requires that the curvature is smooth enough so that lower terms of the Taylor series can be successfully fit. As a result, this method is less effective for image gathers with high frequency noise and complex curvatures.

Kurin and Glogovsky (2003) developed a technique to pick seismic events for normal moveout analysis. Their paper presents a practical approach to the travel-time picking which accounts for the fourth-order term in the common mid-point normal moveout formula. The addition of the fourth-order term to the conventional hyperbolic equation helps to improve the picking results in case non-hyperbolic events exist in the data. However, the approach relies on a successful fitting of the hyperbola and is not practical for complicated near-offset data. In addition, their algorithm is only semi-automated and needs a longer turn-around time to allow for user input to guide the algorithm.

There is therefore a need for a technique that is computationally efficient, has no hyperbolic or parabolic assumption, and at the same time is robust and reliable for processing complex residual moveouts in the common image gathers.

SUMMARY OF THE INVENTION

In one embodiment, the invention is an automated method, meaning that it will typically be performed using a computer, for estimating residual moveout in a common-image gather of seismic data, comprising flattening the common-image gather using depth residuals obtained and optimized through computer-implemented iterative inversion, preferably a conjugate-gradient least-squares process, of the common-image gather.

In another embodiment, the invention is a computer-implemented method for transforming seismic data into an image showing structural features of a subsurface region, comprising:

building an initial seismic wave velocity model in the subsurface region;

applying a depth imaging algorithm to the seismic data to generate common-image gathers;

estimating residual moveout in a common-image gather of the seismic data, comprising flattening the common-image gather using depth residuals obtained and optimized through computer-implemented iterative inversion of the common-image gather;

using the optimized depth residuals in a tomography method to construct a model of seismic wave velocity in the subsurface region; and using the model of seismic wave velocity to migrate the seismic data and thereby produce an image showing structural features of the subsurface region.

In a third embodiment, the invention is a method for producing hydrocarbons from a subsurface region, comprising:

conducting a seismic survey of the subsurface region;

building an initial seismic wave velocity model in the subsurface region;

applying a depth imaging algorithm to the seismic data from the seismic survey to generate common-image gathers;

estimating depth residuals of residual moveout in common-image gathers of seismic data from the seismic survey by a method comprising flattening the common-image gathers using depth residuals obtained and optimized through computer-implemented iterative inversion of the common-image gathers;

using the optimized depth residuals in a tomography method to construct a model of seismic wave velocity in the subsurface region;

using the model of seismic wave velocity to migrate the seismic data and thereby produce an image showing structural features of the subsurface region;

using the image showing structural features of the subsurface region in designing a well into the subsurface region; and drilling the well and producing hydrocarbons from the subsurface region.

BRIEF DESCRIPTION OF THE DRAWINGS

The present invention and its advantages will be better understood by referring to the following detailed description and the attached drawings in which:

FIGS. 1A-1C illustrate the relationship between the migration velocity and the hyperbolic curvature;

FIGS. 2A-2C illustrate how to pick residual moveouts through hyperbolic assumption;

FIGS. 10A-10B compares picking of a synthetic common image gather generated using the velocity model of FIG. 9, with FIG. 10A showing manual picking using hyperbolic assumption, and FIG. 10B showing picking by the present inventive method's automatic estimation; and FIG. 11 shows velocity updates (depth profile) inverted from different picking methods compared to the true velocity model of FIG. 9.

The invention will be described in connection with example embodiments. However, to the extent that the following detailed description is specific to a particular embodiment or a particular use of the invention, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION OF EXAMPLE EMBODIMENTS

Conventional picking of residual moveouts assumes that the moveout follows a hyperbolic or parabolic trajectory. Equation (1) is the most commonly used hyperbolic formula:

$$z^2 = z_0^2 + (\gamma^2 - 1)h^2 \quad (1)$$

where h is half offset between the source and the receiver, z is the depth of the event at h, $z_0$ is the depth of the event at reference half offset $h_0$, and $\gamma$ is the curvature of the residual moveout. FIGS. 1A-1C show three common image gathers generated using different migration velocities. In FIG. 1B, where curvature $\gamma$ is equal to 1, the common image gather is flat, suggesting that the migration velocity used to generate the image gather is correct. When $\gamma$ is less than 1 in FIG. 1A, however, the common image gather curves upward, suggesting that the migration velocity is lower than the correct velocity. On the other hand, when $\gamma$ is larger than 1 as shown in FIG. 1C, the common image gather curves downward, which means that the migration velocity is too high.

The hyperbolic picking process is illustrated in FIGS. 2A-2C, where FIG. 2A shows the input common image gather with offset h as the horizontal coordinate and depth z as the vertical coordinate. Hyperbolic picking needs to first transform the input gather from (z,h) domain into $(z_0,\gamma)$ domain as shown in FIG. 2B. Then picking is conducted in the $(z_0,\gamma)$ domain by selecting peak amplitude of the contours. A pick of basically a point in the $(z_0,\gamma)$ domain (FIG. 2B) is equivalent to picking an entire residual moveout in the original (z,h) domain as illustrated in FIG. 2C.

As noted above, this conventional picking technology assumes that residual moveout follows a single hyperbolic curvature throughout the entire offset or angle range. In reality, however, it is common to observe much more complicated residual curvature because field data may contain different wave modes, and the migration velocity used may differ far from the true underground velocity. Nevertheless, this hyperbolic or parabolic assumption has been used by most manual picking methods and by some automatic picking methods, for instance, the automatic $\gamma$ scan.

Figure 3:
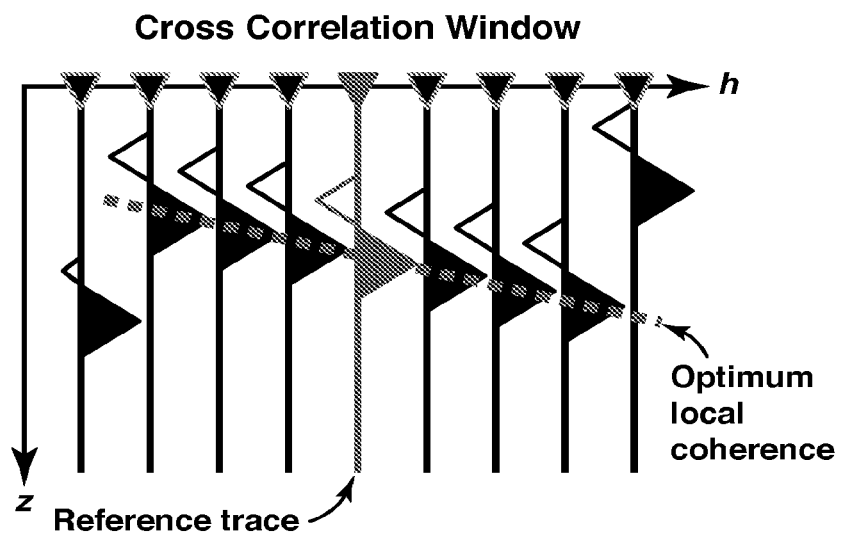
FIG. 3 illustrates how to estimate the optimum dip through cross correlation.

Many more automatic picking methods, however, are based on a cross-correlation technique which computes the coherency between a reference trace and its neighboring traces as illustrated in FIG. 3. To estimate the dip field using cross correlation, one typically selects a window of traces centered about the reference trace. By cross correlating the reference trace with all other traces within the window, the optimum local coherence can be obtained which is along the dashed line direction in FIG. 3. The best dip estimate is along the same direction. Obviously, this is a local solution to the residual moveout, and the dip estimation is sensitive to the size of the cross correlation window and the S/N ratio of the data.

An objective of this invention then is to find a global solution to measuring the residual moveout. It should be able to handle arbitrary residual moveouts and should be highly efficient for 3D velocity model building.

Theory

A key idea of this invention is to iteratively flatten the common image gathers against a specified reference trace through the application of conjugate-gradient least-squares inversion. Different from other picking methods which need to identify and track strong amplitudes, the proposed method automatically inverts for the depth residual for every grid point in the image gather. There is no need to identify and track events in this inventive method.

Figure 4:
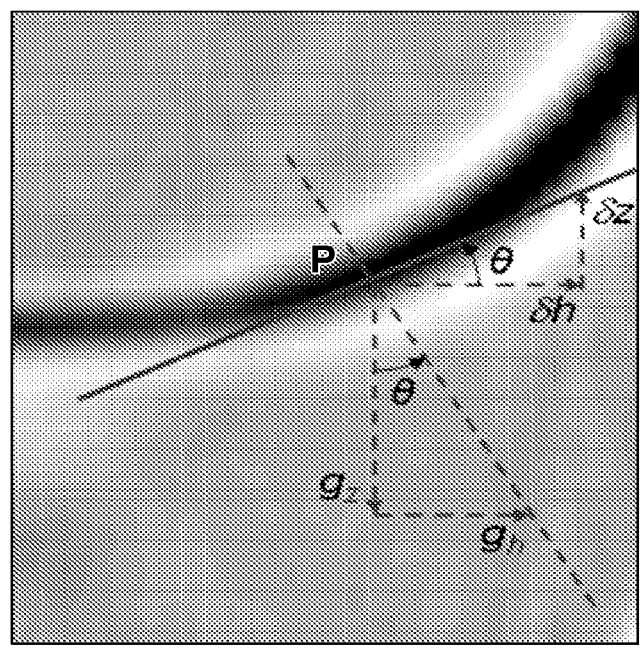
FIG. 4 describes how to compute gradients and dip in one embodiment of the present inventive method.

FIG. 4 shows a simple common image gather with a single residual moveout. The present inventive method may start by exploiting the gradient information of the wave front. For an image point P shown in FIG. 4, $g_h$ and $g_z$ are horizontal and vertical gradients, $\delta h$ and $\delta z$ are horizontal and vertical shifts, and $\theta$ is the dip angle measured between the horizontal direction and the tangent direction of the residual moveout. The gradients can be computed by $$g_h = \nabla_h u(i,j) = \frac{\partial u(i,j)}{\partial h} \quad (2)$$

$$g_z = \nabla_z u(i,j) = \frac{\partial u(i,j)}{\partial z}$$

where $\alpha$ denotes the gradient and u(i,j) represents the wave field at any location of the image gather, not necessarily exactly on a residual moveout with strong coherence. In other words, u represents the input common image gather. As stated previously, this is the pressure data measured by seismic receivers as a function of time, but after being transformed to the image domain (depth-offset, or depth-angle), from which a gather is selected consisting of traces having a common image point. The depth residual can then be obtained by computing $$\delta z = \delta h \tan\theta = \delta h \frac{\nabla_h u(i,j)}{\nabla_z u(i,j)} \quad (3)$$

It is well known that a conventional inversion equation may be written as Ax=b, where x is the unknown to be solved for. For the case of residual moveout estimation, obviously x is the depth residual. Thus, the inversion equation becomes $$A\delta z = b \quad (4)$$

To construct an inversion system so that it is in the same form as equation (4), we simply need to re-organize equation (3) and then get $$\alpha_z u \delta z = \delta h \alpha_h u \quad (5)$$

Equation (5) is the inversion system Ax=b for the specific problem of residual moveout estimation, where $$A = \alpha_z u$$

$$x = \delta z$$

$$b = \delta h \alpha_h u \quad (6)$$

Both x and b have m×n elements. Here m and n stand for the dimensions of the common image gather. Specifically, m represents the number of offsets or angles, and n represents the number of depths. Thus, the inversion system is neither over-determined nor under-determined, which guarantees a rapid convergence of the algorithm Matrix A has m×n×m×n elements, which is large, but it is diagonal, super sparse, and turns out to be helpful for reducing memory requirement and gaining computational efficiency.

Equation (7) shows a conventional cost function in the L2-norm for a general inversion system $$E = \|Ax - b\|^2 + \lambda_0 \|x\|^2 + \lambda_1 \|\alpha x\|^2 \quad (7)$$

where $\lambda_0$ is the damping coefficient and $\lambda_1$ is the regularization coefficient. To handle our specific residual moveout inversion problem, a new cost function may be used in the present inventive method:

$$E = \|Ax - b\|^2 \cong \|W_1 \alpha_z u C \delta z - W_2 \alpha_h u\|^2 \quad (8)$$

where $W_1(i,j)$ and $W_2(i,j) = \delta W_1(i,j)$ are weighting functions based on local coherence, where i=1, 2, . . . m, j=1, 2, . . . n. (Each (i,j) stands for a discrete cell in the entire space of (m,n).) When the common image gathers are noisy, $W_1$ and $W_2$ constrain the convergence using strong and coherent events and help guarantee the system to be stable. In equation (8), C is a pre-conditioner which helps attenuate high frequency noise and avoid converging into local minima. The factors $W_1$, $W_2$ and C, while preferable, are not absolutely essential to the inversion, which will typically work even if these quantities are set to unity.

Implementation

Figure 5:
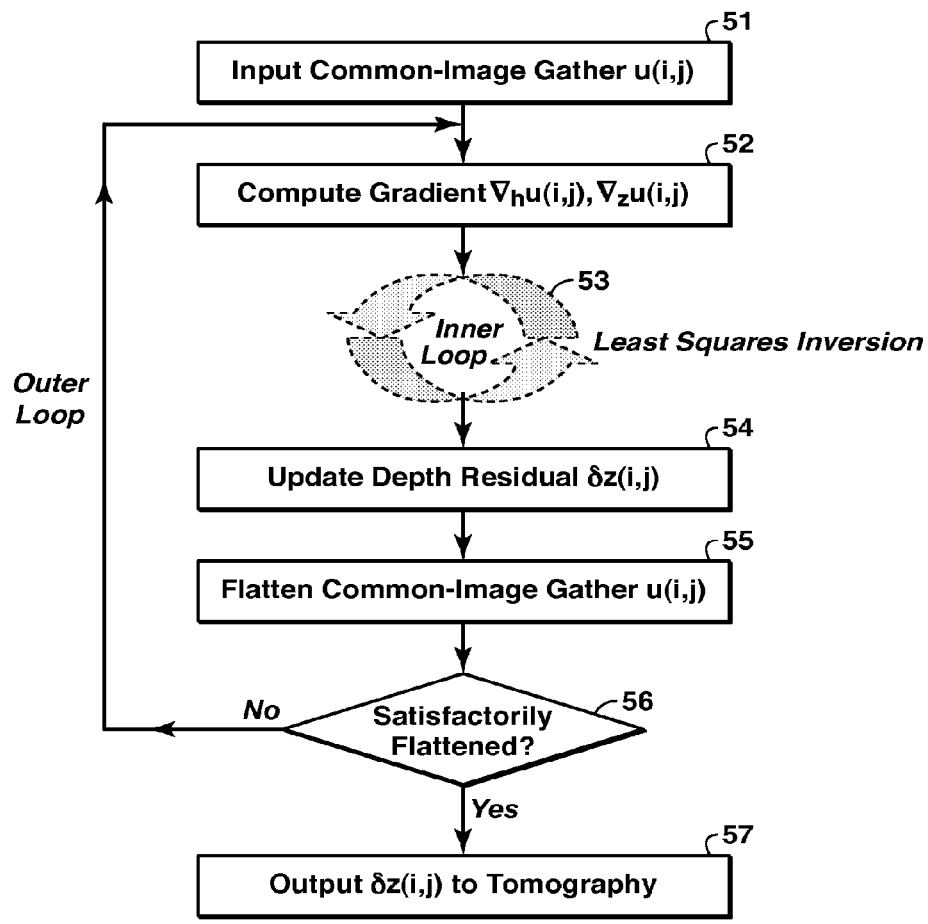
FIG. 5 is a flowchart showing basic steps in one embodiment of the present inventive method.

The present inventive method iteratively flattens the common image gathers based on depth residuals generated by a conjugate gradient least squares inversion scheme. In each iteration, depth residuals are first estimated relative to a reference offset or a reference angle in the image gather and then the gather is partly flattened against the same reference trace. As iteration proceeds, the gathers are further flattened and an optimized depth residual field is achieved. These depth residuals will typically be provided to a tomography algorithm for future velocity inversion. Basic steps in one embodiment of the invention can be described as follows, as indicated in the flowchart of FIG. 5:

Step

51. Input a common-image gather to the algorithm,
52. Compute horizontal and vertical gradients for every grid point,
53. Apply conjugate-gradient least-squares inversion to compute and then optimize the depth residuals,
54. Update depth residuals for every grid point in the gather, i.e. at every discrete point in the common-image gather domain,
55. Flatten the gather against a selected reference trace by using the depth residuals to adjust the depth of the image point,
56. Repeat steps 2-5 until the gather is satisfactorily flattened, and
57. Output depth residuals to velocity tomography.

In step 55, the specified reference trace is assumed to have the correct image depths, and the inverted depth residuals are used to correct all grid points in the common-image domain, relative to the reference trace. Typically, larger offsets hold more information about the velocity error because they have longer raypaths. Thus, the zero offset trace is considered to have less error and is typically used as the reference trace. In the end, as the iterative process evolves, it doesn't matter which trace is specified as the reference trace. When the gather is satisfactorily flattened in step 56 is preferably judged manually by the user, although the computer software program that carries out the computations for the invention may have a default stopping point after some specified number of iterations.

Examples

Figures 6A, 6B, 6C, 6D:
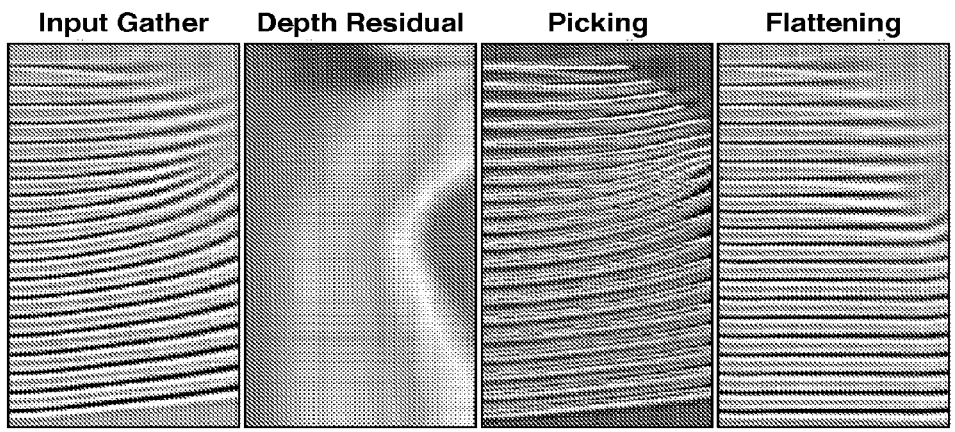
FIGS. 6A-6D show a test example of a residual moveout estimation of a single common image gather using the present inventive method: (A) the original input gather, (B) depth residual estimated, (C) picking QC, and (D) flattening QC.

In this section, some synthetic-data test examples will be presented to demonstrate the effectiveness of the present inventive method. In FIGS. 6A-6D, depth is plotted vertically and offset is plotted horizontally. FIG. 6A shows an input common image gather, where the first event curves downward, and all other events curve upward. The largest curvature happens at the middle part of the gather. FIG. 6B shows the inverted depth residuals, which will be used by a tomographic inversion scheme. Notice that the large values in FIG. 6B, denoted by red in the original color data display, match those large curvatures in FIG. 6A, suggesting that the algorithm is generating reasonable depth residuals. To further quality-control (QC) the inversion result, depth residual values in FIG. 6B are extracted and then used for picking QC (FIG. 6C) and flattening QC (FIG. 6D). In FIG. 6C, the white picking lines track the events (reproduced from FIG. 6A) well, whereas in FIG. 6D, all events are well flattened, both of which further verify the effectiveness of the proposed algorithm. FIG. 6C is labeled "picking," because that word aptly describes the corresponding step in the traditional method for estimating residual moveout, where the interpreter is confronted with choices to make, but in the present inventive method, this step is a quality control step. The inversion process (step 53 in FIG. 5) generates the residual moveout estimates, identifying the grid points along strong coherent events in the common image gather and then outputting their coordinates for future use. Looking at an output display such as FIG. 6C merely serves as a check that there is no bug infecting the process.

Figure 7A:
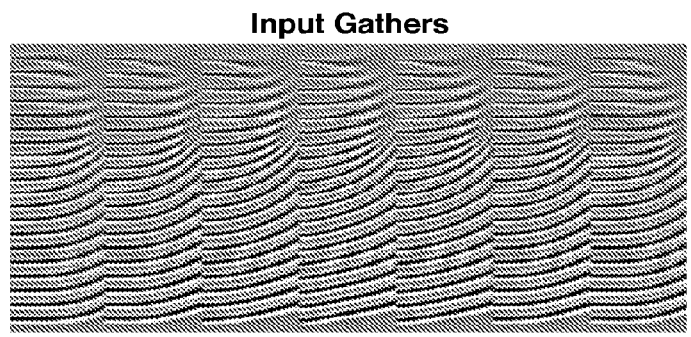
FIGS. 7A-7D show a test example of a residual moveout estimation of several common image gathers using the present inventive method: (A) the original input gathers, (B) depth residual fields after inversion, (C) picking QC, and (D) flattening QC.
Figure 7B:
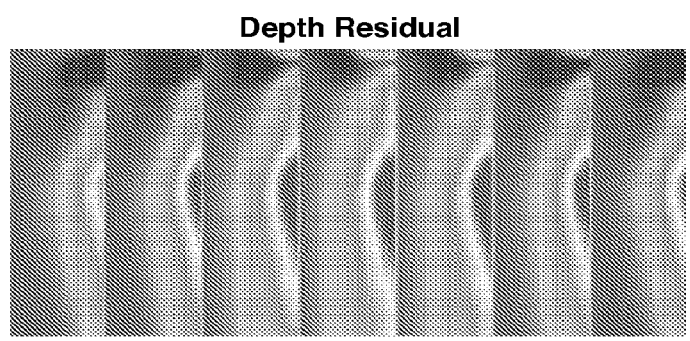
Figure 7C:
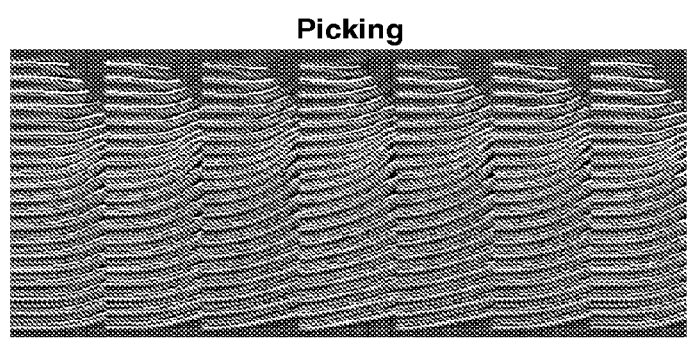
Figure 7D:
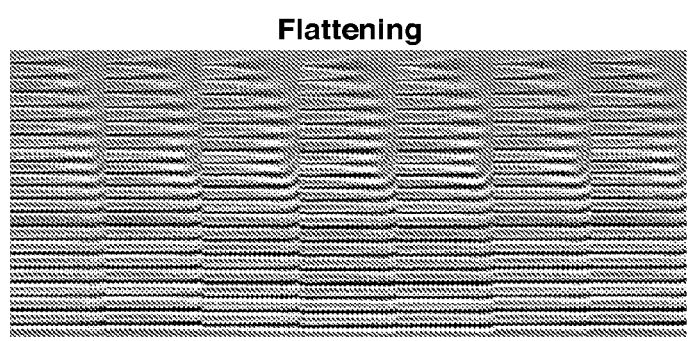

The second example is for the same synthetic data as shown in FIG. 6 except more image gathers are processed. FIG. 7A displays the input gathers with noticeable changes of the curvature from the left to the right. FIG. 7B shows the depth residual fields obtained by inversion, where the change of the color (in the original color data displays) matches the change of the curvature in FIG. 7A. Again, FIGS. 7C-7D further confirm that both the picking result and the flattening result are satisfactory.

Figures 8A, 8B, 8C:
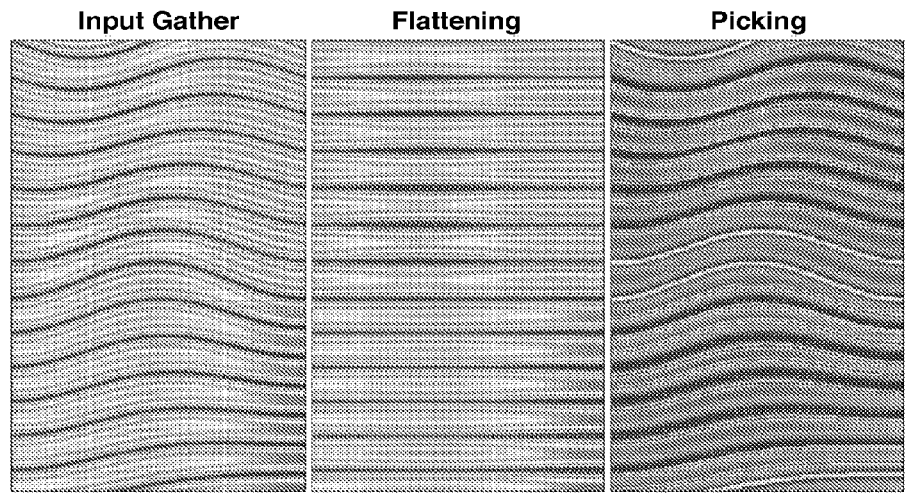
FIGS. 8A-8C illustrate application of the present inventive method to a pseudo converted-wave common-image gather: (A) the original input gather, (B) flattening QC, and (C) picking QC.

A third example is to test the present inventive method on a complex common image gather, where we try to mimic converted waves (meaning P-waves reflected as shear waves) as shown in FIG. 8A. It is shown in FIGS. 8B and 8C that the method can handle residual moveouts with complex multiple curvatures.

Figure 9:
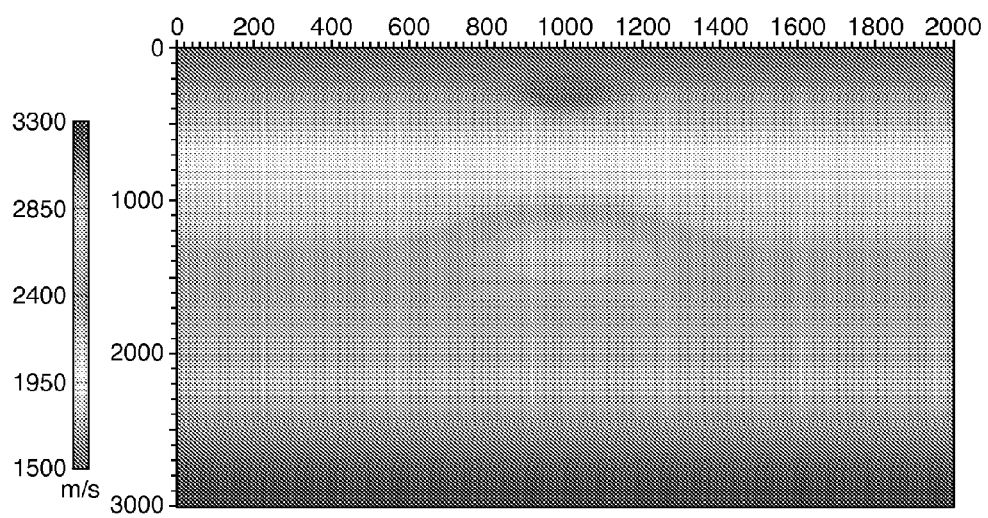
FIG. 9 shows an assumed ("true") velocity model used in forward modeling in a fourth synthetic test example of the present inventive method.

An ultimate objective of the proposed method is to provide reliable depth residuals to velocity tomography. Therefore, the last example application of the present inventive method is to find out whether the depth residuals generated by the proposed algorithm are useable by tomography. FIG. 9 shows the "true" velocity model, based on which a forward modeling scheme is run to generate a synthetic data volume. At the center location of the model, there is a low velocity anomaly at a shallow depth and a high velocity anomaly at the middle depth. The former can be seen as a patch of darker red extending down toward the yellow band and the latter as a patch of blue within the central green band in the original colored data display.

The synthetic data may then be fed into a ray-based depth-imaging algorithm to generate common image gathers. FIGS. 10A-10B shows a comparison between hyperbolic manual picking (FIG. 10A) and the automatic estimation method of the present invention (FIG. 10B). The manual picking in FIG. 10A is not a true manual picking which is quite slow. Instead, the lines in the input gather are best-fit to a hyperbola. The "picked" residual moveouts are shown in both figures by the jagged curves, which are blue in the original color data displays. The manual picking (FIG. 10A) and the automatic estimation (FIG. 10B) generate similar results at near offsets. However, at far offsets, the automatic method of the present invention clearly tracks the residual moveouts better. FIG. 11 shows the velocity profiles inverted from different picking methods. The true model from FIG. 9 is 111 and the initial model for the iterative picking methods is 112. The updated model using the automated method of the present invention is 113, and the updated model using manual picking is 114. The velocity profile (velocity plotted along the horizontal axis vs. depth on the vertical axis) from automatic estimation (113) is slightly better than that from the manual picking (114) in both of the enclosed anomaly areas.

The foregoing description is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined by the appended claims.

REFERENCES

Baysal, E., D. D. Kosloff, and J. W. C. Sherwood, "Reverse-time migration," *Geophysics* 48, 1514-1524 (1983).
Bevc, D., "Imaging complex structures with semi-recursive Kirchhoff migration," *Geophysics* 62, 577-588 (1997).
Gray, S. H., and May, W. P., "Kirchhoff migration using Eikonal equation traveltimes," *Geophysics* 59, 810-817 (1994).
Kurin, E., and Glogovsky, V., "An algorithm for semi-automated traveltime picking based on the non-hyperbolic moveout," $73^{rd}$ Annual International Meeting, SEG, Expanded Abstracts, 2168-2171 (2003).
Lee, R., "Pitfalls in seismic data flattening," *The Leading Edge* 20, 160-164 (2001).
Lomask, J., Guitton, A., Fomel, S., Claerbout, J., and Valenciano, A., "Flattening without picking," *Geophysics* 71, 13-20 (2006).
McMechan, G. A., "Migration by extrapolation of time-dependent boundary values," *Geophysical Prospecting* 31, 413-420 (1983).
Siliqi, R. P., Herrmann, A. Prescott, and L. Capar, "High order RMO picking using uncorrelated parameters," $77^{th}$ Annual International Meeting, SEG, Expanded Abstracts, 2772-2775 (2007).
Sun, Y., Qin, F., Checkles, S., and Leveille, J. P., "3-D prestack Kirchhoff beam migration for depth imaging," *Geophysics* 65, 1592-1603 (2000).
Whitmore, N. D., "Iterative depth migration by backward time propagation," $53^{rd}$ Annual International Meeting, SEG, Expanded Abstracts, 382-385 (1983).

The invention claimed is:

1. An automated method for estimating residual moveout in a common-image gather of seismic data for a subsurface region, comprising:
   obtaining and optimizing depth residuals through computer-implemented iterative inversion of the common-image gather, using flatness of the common image gather as a criterion for the optimization,
   wherein the inversion is a conjugate-gradient least-squares process, and
   wherein the conjugate-gradient least-squares process includes,
      (a) calculating horizontal offset and depth gradients of the common image gather, at all points on a selected computational grid, and
      (b) applying least-squares inversion to the horizontal offset and depth gradients to compute and optimize the depth residuals;
   using the optimized depth residuals in a tomography method to construct a model of seismic wave velocity in the subsurface region;
   using the model of seismic wave velocity to migrate the seismic data and thereby produce an image of estimated residual moveout, showing structural features of the subsurface region;
   using the image showing structural features of the subsurface region in designing a well into the subsurface region; and
   drilling the well and producing hydrocarbons from the subsurface region.

2. The method of claim 1, wherein in each iteration, the depth residuals are first estimated relative to a reference trace corresponding to a selected offset or angle in the common-image gather, and then the common-image gather is partly flattened against the same reference trace.

3. The method of claim 1, wherein each cycle of the iterative inversion comprises flattening the common-image gather by shifting seismic events using the optimized depth residuals.

4. The method of claim 1, further comprising calculating at least one coherence function at each of said grid points and then using the at least one coherence function as a weighting function in a cost function selected for the conjugate-gradient least-squares process, wherein the at least one coherence function constrains the iterative inversion to make it more stable.

5. The method of claim 1, wherein the common-image gather is either an offset domain or angle domain common-image gather generated from any pre-stack depth imaging scheme.

6. The method of claim 1, wherein the horizontal and vertical gradients are computed using a space-domain finite-difference operator.

7. The method of claim 1, wherein the optimizing comprises updating the depth residuals in each cycle of the iteration by accumulation.

8. The method of claim 1, wherein the common-image gather is flattened by adjusting vertical location of residual moveout in the common-image gather.

9. The method of claim 1 wherein the common-image gather is flattened through a vertical interpolation to alleviate a problem of waveform distortion.

10. The method of claim 1, wherein high frequency noise is removed by a band-pass filter from the common-image gather before the iterative inversion.

11. A computer-implemented method for transforming seismic data into an image showing structural features of a subsurface region, comprising:
   building an initial seismic wave velocity model in the subsurface region;
   applying a depth imaging algorithm to the seismic data to generate common-image gathers;
   estimating residual moveout in a common-image gather of the seismic data, comprising flattening the common-image gather using depth residuals obtained and optimized through computer-implemented iterative inversion of the common-image gather,
   wherein the inversion is a conjugate-gradient least-squares process, and
   wherein the conjugate-gradient least-squares process includes,
      (a) calculating horizontal offset and depth gradients of the common image gather, at all points on a selected computational grid, and
      (b) applying least-squares inversion to the horizontal offset and depth gradients to compute and then optimize the depth residuals;
   using the optimized depth residuals in a tomography method to construct a model of seismic wave velocity in the subsurface region;
   using the model of seismic wave velocity to migrate the seismic data and thereby produce an image showing structural features of the subsurface region;
   using the image showing structural features of the subsurface region in designing a well into the subsurface region; and drilling the well and producing hydrocarbons from the subsurface region.

12. A method for producing hydrocarbons from a subsurface region, comprising:

conducting a seismic survey of the subsurface region;

building an initial seismic wave velocity model in the subsurface region;

applying a depth imaging algorithm to seismic data from the seismic survey to generate common-image gathers;

estimating depth residuals of residual moveout in common-image gathers of seismic data from the seismic survey by a method comprising flattening the common-image gathers using depth residuals obtained and optimized through computer-implemented iterative inversion of the common-image gathers, wherein the inversion is a conjugate-gradient least-squares process, and wherein the conjugate-gradient least-squares process includes, (a) calculating horizontal offset and depth gradients of the common image gather, at all points on a selected computational grid, and (b) applying least-squares inversion to the horizontal offset and depth gradients to compute and then optimize the depth residuals;

using the optimized depth residuals in a tomography method to construct a model of seismic wave velocity in the subsurface region;

using the model of seismic wave velocity to migrate the seismic data and thereby produce an image showing structural features of the subsurface region;

using the image showing structural features of the subsurface region in designing a well into the subsurface region; and drilling the well and producing hydrocarbons from the subsurface region.

\* \* \* \* \*